(12) United States Patent
Chen et al.

(10) Patent No.: US 10,700,517 B2
(45) Date of Patent: Jun. 30, 2020

(54) ACTIVE SURGE PROTECTION STRUCTURE AND SURGE-TO-DIGITAL CONVERTER THEREOF

(71) Applicant: AMAZING MICROELECTRONIC CORP., New Taipei (TW)

(72) Inventors: Wen-Chieh Chen, Zhongli (TW); Ming-Dou Ker, Jhu-Bei (TW); Ryan Hsin-Chin Jiang, Taipei (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 234 days.

(21) Appl. No.: 16/042,144

(22) Filed: Jul. 23, 2018

(65) Prior Publication Data

US 2020/0028355 A1 Jan. 23, 2020

(51) Int. Cl.
*H02H 9/04* (2006.01)
*H01L 27/02* (2006.01)
*H02H 1/00* (2006.01)

(52) U.S. Cl.
CPC ......... *H02H 9/046* (2013.01); *H01L 27/0266* (2013.01); *H02H 1/0007* (2013.01)

(58) Field of Classification Search
CPC ............ H02H 9/05; H02H 9/008; H02H 9/02; H02H 9/025; H02H 9/04; H02H 9/046; H02H 1/0007; H01L 27/0251; H01L 27/0266; H01L 27/0248
See application file for complete search history.

(56) References Cited

U.S. PATENT DOCUMENTS

| | | | | |
|---|---|---|---|---|
| 7,266,195 B1 * | 9/2007 | Dupuis | ................. | H04M 1/745 379/399.01 |
| 8,854,786 B2 | 10/2014 | Fu et al. | | |
| 9,001,478 B2 | 4/2015 | Ker et al. | | |
| 2007/0014064 A1 * | 1/2007 | Souma | ............... | H03K 17/0822 361/91.7 |
| 2011/0043953 A1 * | 2/2011 | Ker | ........................ | H02H 9/046 361/56 |
| 2013/0222958 A1 * | 8/2013 | Fu | ............................ | H02H 9/04 361/91.1 |
| 2015/0194802 A1 * | 7/2015 | Zhu | ..................... | H04L 25/0272 361/86 |
| 2017/0365999 A1 * | 12/2017 | Cao | ......................... | H02S 40/30 |
| 2020/0014200 A1 * | 1/2020 | Peng | .................. | H01L 23/5228 |

* cited by examiner

*Primary Examiner* — Adolf D Berhane
(74) *Attorney, Agent, or Firm* — Rosenberg, Klein & Lee

(57) ABSTRACT

An active surge protection structure is provided between a power line and a core circuit, comprising a surge-to-digital converter and a clamp circuit. The surge-to-digital converter comprises a plurality of surge detection circuit. Each surge detection circuit detects a surge event occurring on the power line and generates a digital signal. The clamp circuit is disposed adjacent to the core circuit and electrically connected with the surge-to-digital converter and the power line where the core circuit is connected for dissipating surge energy. The clamp circuit receives and is driven by the digital signals from the surge-to-digital converter such that its protection flexibility can be achieved according to the digital signals. By employing the present invention, it is extraordinarily advantageous of improving system stability and achieving comprehensive surge protection with configuration of driving capability dependent on surge levels.

20 Claims, 14 Drawing Sheets

ACTIVE SURGE PROTECTION STRUCTURE AND SURGE-TO-DIGITAL CONVERTER THEREOF

BACKGROUND OF THE INVENTION

Field of the Invention

The present invention relates to a surge protection design, and more particularly to an active on-chip surge protection structure and multi-bit surge-to-digital converter thereof.

Description of the Prior Art

Surge events can be induced on power lines from power system switching transients. Surge stresses with high voltage and long duration in microseconds produce high energy through CMOS ICs. The international standard IEC61000-4-5 has specified the 1.2/50-µs combination waveform of a surge event which is shown in FIG. 1. The excessive heat from surge events is harmful to devices in ICs, especially in advanced CMOS technology with vulnerable gate oxide. To improve such electrical overstress (EOS) issue, some passive discrete elements, such as transient voltage suppressor (TVS), gas discharge tube (GDT) and metal oxide varistor (MOV) are usually utilized in microelectronic systems to dissipate surge energy. Besides, big MOSFET clamp is also applied for active surge protection to dissipate residual surge energy induced into ICs to achieve better protection ability. However, it may result in unnecessary power-on reset process or malfunction due to unregulated driving capability of big MOSFET clamp discharging surge energy.

In another aspect, passive discrete elements are typically applied for board-level surge protection. FIG. 2 presents the protection scheme which consists of discrete decoupling circuits 100 and voltage limiting circuits 200 between a power input 102 and a protected load 104. Nevertheless, these passive protection elements are disposed discrete and merely applied on board. The demands for active on-chip surge protection design still can not be satisfied.

Therefore, on account of above, to overcome the above-mentioned problems, it should be obvious that there is indeed an urgent need for the professionals in the field for a novel active on-chip surge protection design to be developed that can effectively solve those above mentioned problems occurring in the prior design.

SUMMARY OF THE INVENTION

In order to overcome the above-mentioned disadvantages, an approach in accordance with the present invention is provided for an active surge protection structure and surge-to-digital converter thereof.

To improve system stability as well as achieve good surge robustness, an extendable surge-to-digital converter is proposed in this invention which can be applied for an active on-chip surge protection design with configuration of surge level dependent on driving capability.

In one aspect, an active surge protection structure of the present invention is disposed adjacent to a core circuit and electrically connected to a power line where the core circuit is connected. The active surge protection structure of the present invention comprises a surge-to-digital converter and a clamp circuit.

The surge-to-digital converter is connected to a high voltage level $V_{DD}$ and a low voltage level $V_{SS}$, and comprises a plurality of surge detection circuit, wherein each of the surge detection circuits detects a surge event occurring on the power line and generates a digital signal when the surge event occurs.

The clamp circuit is electrically connected with the power line and the surge-to-digital converter, and being disposed adjacent to the core circuit for dissipating surge energy when the surge event occurs on the power line, wherein the clamp circuit receives and is driven by a plurality of the digital signal from the surge-to-digital converter such that protection flexibility of the clamp circuit can be adjusted according to the plurality of the digital signal.

According to the present invention, the proposed clamp circuit is a power MOSFET which comprises a plurality of finger, and the plurality of finger is turned on or off depending on the plurality of the digital signal such that protection flexibility of the clamp circuit is adjusted. In one embodiment, the fingers of the clamp circuit can be turned on partially. In other embodiment, the fingers of the clamp circuit can be turned on completely as well.

Furthermore, each surge detection circuit of the present invention further comprises a voltage detect unit, a memory unit, a buffer unit and a reset control unit. The voltage detect unit is connected between the power line, the high voltage level $V_{DD}$ and the low voltage level $V_{SS}$ for recognizing the surge event; the memory unit is electrically connected between the power line, the high voltage level $V_{DD}$ and the low voltage level $V_{SS}$ and in parallel with the voltage detect unit; the buffer unit is electrically connected between the memory unit and the clamp circuit, such that when the voltage detect unit recognizes the surge event, the voltage detect unit writes a record to the memory unit and the digital signal is generated through the buffer unit; and the reset control unit is electrically connected to the memory unit, the buffer unit, and the low voltage level $V_{SS}$ for sending a reset signal.

According to the embodiment of the present invention, the digital signal is a transient bit, turning from "0" to "1" indicating that the surge event is detected.

For example, when the surge-to-digital converter comprises N surge detection circuits, the surge-to-digital converter is an N-bit surge-to-digital converter, and a plurality of finger of the clamp circuit is divided into N groups connected to the N digital output bits, respectively.

In another aspect, the present invention discloses a multi-bit surge-to-digital converter, which is connected to a power line, and comprises a plurality of surge detection circuit, wherein each of the surge detection circuits detects a surge event occurring on the power line, generates a digital signal when the surge event occurs, and comprises a voltage detect unit, a memory unit, a buffer unit and a reset control unit. The voltage detect unit is connected between the power line, a high voltage level $V_{DD}$ and a low voltage level $V_{SS}$ for recognizing the surge event; the memory unit is electrically connected between the power line, the high voltage level $V_{DD}$ and the low voltage level $V_{SS}$ and in parallel with the voltage detect unit; the buffer unit is electrically connected between the memory unit and a clamp circuit, such that when the voltage detect unit recognizes the surge event, the voltage detect unit writes a record to the memory unit and the digital signal is generated through the buffer unit to drive the clamp circuit; and the reset control unit is electrically connected to the memory unit, the buffer unit, and the low voltage level $V_{SS}$ for sending a reset signal.

According to one embodiment of the present invention, the voltage detect unit may further comprise a serially-stacked string of PMOSFET, NMOSFET, diode, or a combination of the above. For a variety of detecting sensitivity, each voltage detect unit of the surge detection circuits may comprise different numbers of PMOSFET, NMOSFET, diode, or a combination of the above for composing the serially-stacked string.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
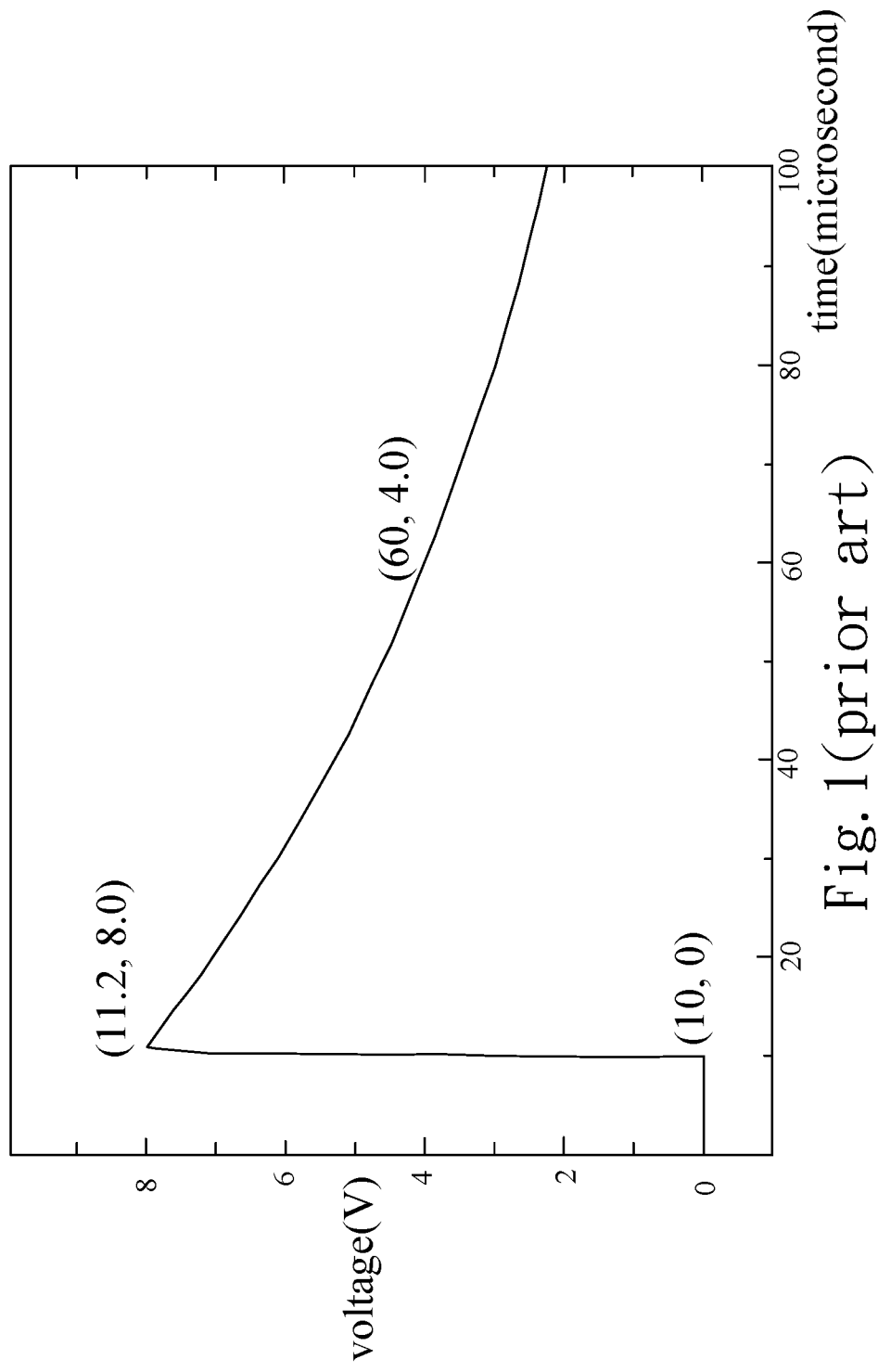
FIG. 1 shows a simulation of 1.2/50-µs combination waveform of a surge event with 8-V pulsed voltage.
Figure 2:
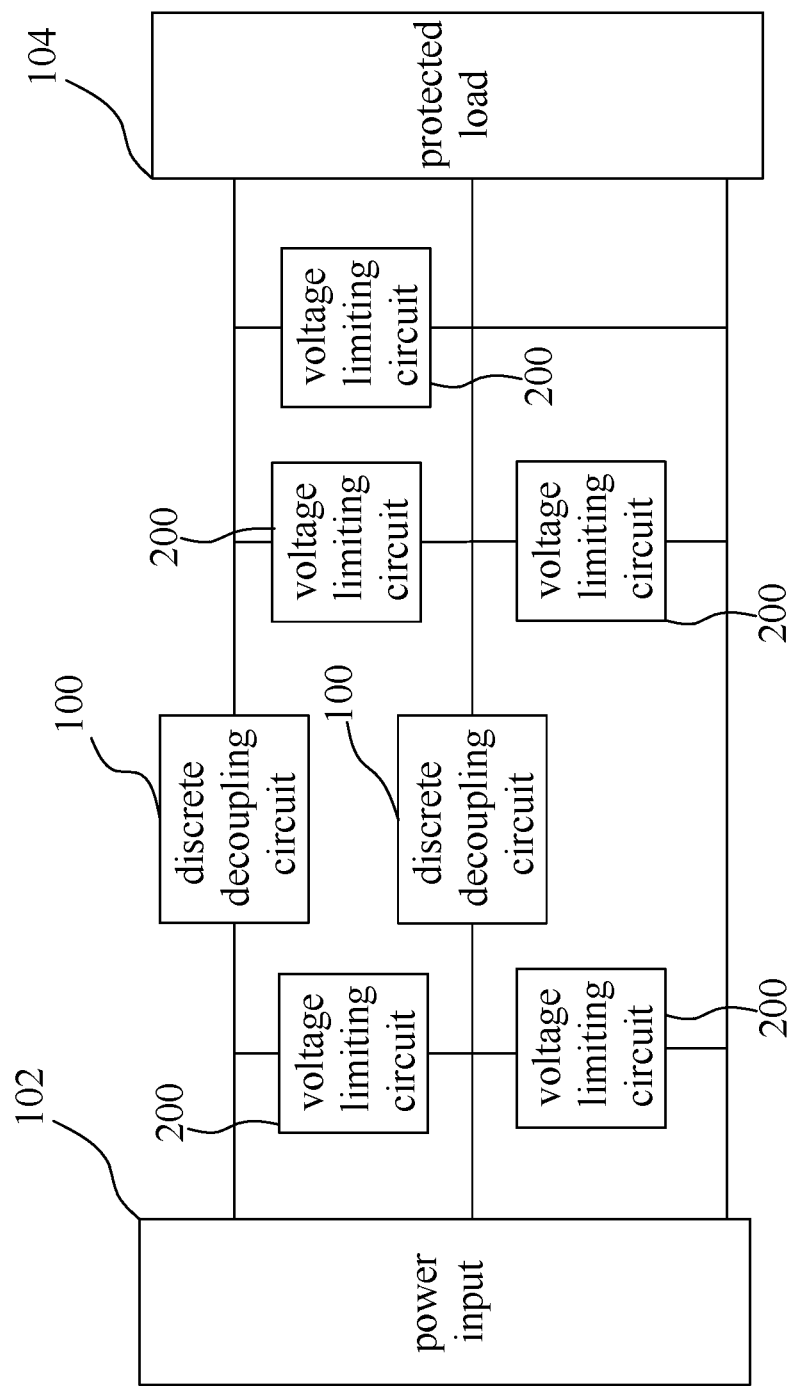
FIG. 2 shows a block diagram of a surge protector between power supply and protected load in a conventional board-level surge protection adopting passive discrete elements.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In order to overcome the conventional problems, the proposed structure of the present invention provides an active surge protection structure and its multi-bit surge-to-digital converter thereof, which adopt the multi-bit surge-to-digital converter for generating multiple output voltages so as to convert into multiple digital signals for selectively controlling on and off states of fingers of a big MOSFET clamp such that unexpected power-on reset action, redundant power dissipation or unpredictable malfunction can be effectively eliminated and prevented.

Figure 3:
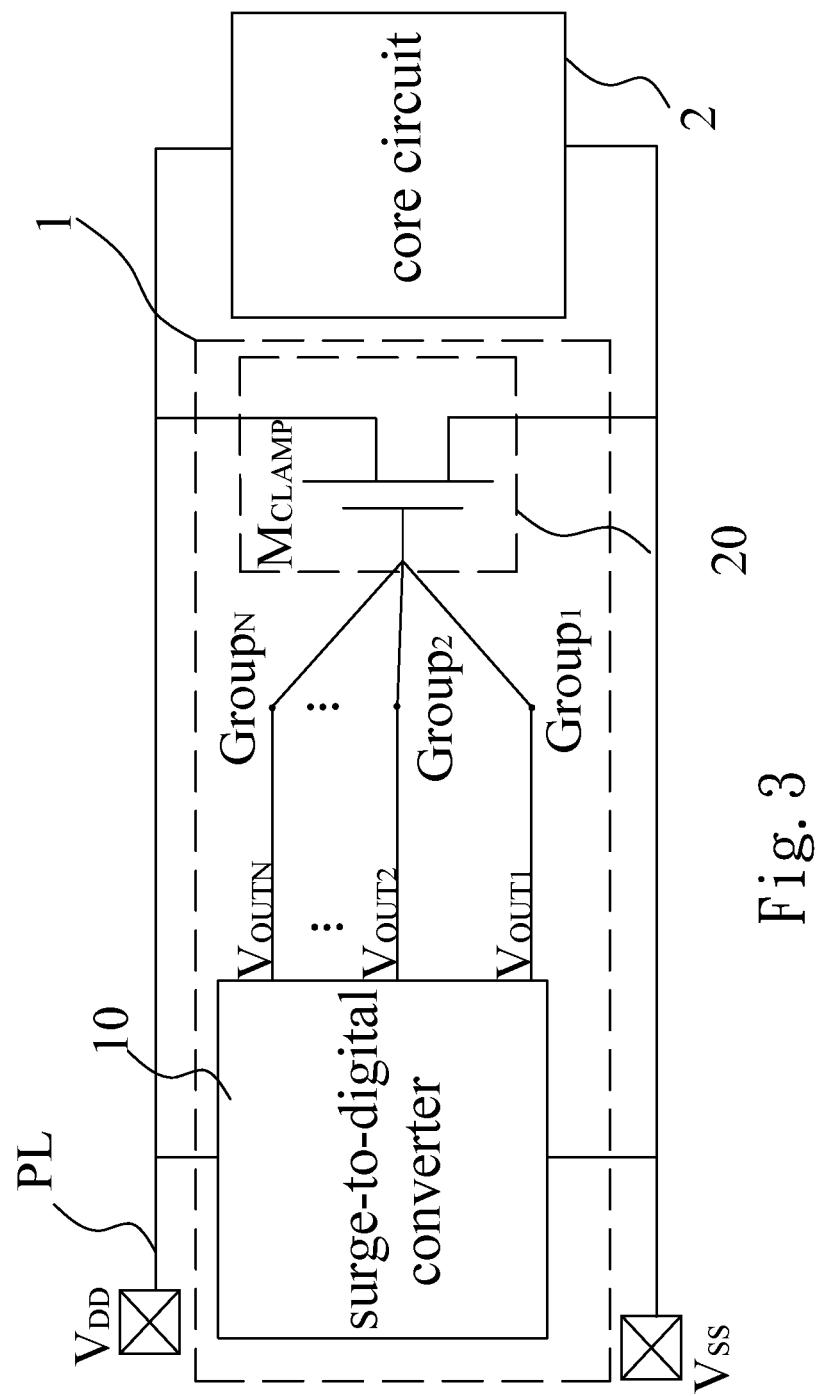
FIG. 3 shows a block diagram of an active surge protection structure in accordance with one embodiment of the present invention.

First of all, please refer to FIG. 3, which shows a block diagram of an active surge protection structure in accordance with one embodiment of the present invention.

The active surge protection structure 1 of the present invention is disposed adjacent to a core circuit 2 and electrically connected to a power line PL where the core circuit 2 is connected. The active surge protection structure 1 of the present invention comprises a surge-to-digital converter 10 and a clamp circuit 20, wherein the active surge protection structure 1 is connected to a high voltage level $V_{DD}$ and a low voltage level $V_{SS}$ for detecting a surge event occurring on the power line PL. The clamp circuit 20 is electrically connected with the power line PL and the surge-to-digital converter 10, and the clamp circuit 20 is disposed adjacent to the core circuit 2 for dissipating surge energy when the surge event is detected on the power line PL. Under such circumstances, the surge energy is dissipated through the clamp circuit 20 and thus prevents the core circuit 2 from being harmed or damaged. According to one embodiment of the present invention, the clamp circuit 20 is a power MOSFET (i.e. a big MOSFET) which comprises a plurality of finger.

Figure 4:
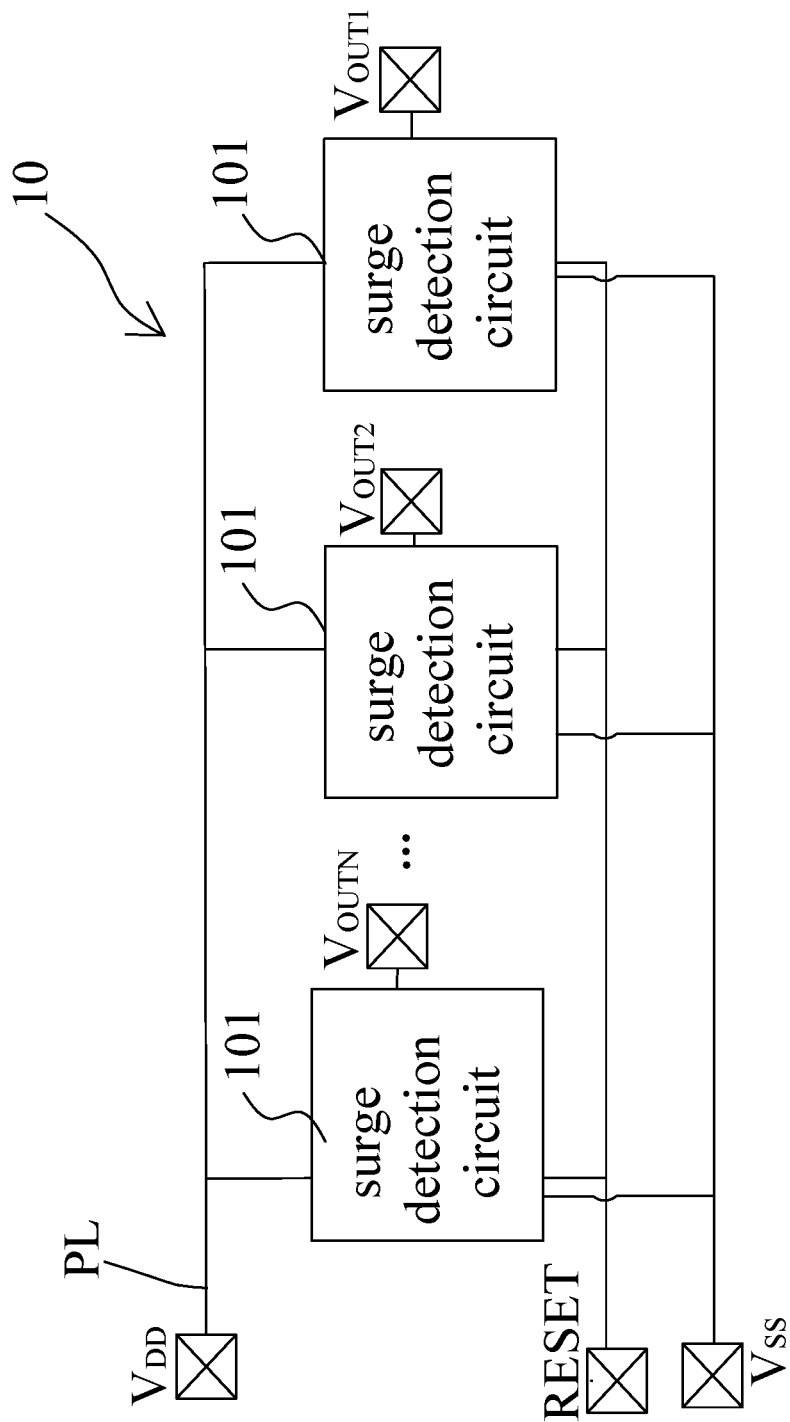
FIG. 4 shows a block diagram of a multi-bit surge-to-digital converter in accordance with one embodiment of the present invention.

In such a surge protection design, high surge energy is usually dissipated by the big MOSFET clamp. However, a fixed size of MOSFET clamp with excessive driving capability may result in unexpected power-on reset action, redundant power dissipation or unpredictable malfunction. In order to improve the system stability under surge events, the plurality of finger of the big MOSFET clamp can be divided into multiple groups for adjusting its driving capabilities. In other words, as shown in FIG. 4, which shows a block diagram of the multi-bit surge-to-digital converter according to one embodiment of the present invention, the surge-to-digital converter 10 of the present invention is proposed to comprise a plurality of surge detection circuit 101, wherein each surge detection circuit 101 detects the surge event occurring on the power line PL and generates an output voltage ($V_{OUTN}$ ... $V_{OUT2}$, $V_{OUT1}$) when the surge event occurs. Please refer to FIG. 3 and FIG. 4 at the same time. These output voltages ($V_{OUTN}$ ... $V_{OUT2}$, $V_{OUT1}$) are received by the clamp circuit 20 and drive the clamp circuit 20 to dissipate the surge energy. To overcome the above mentioned problems that a fixed size of MOSFET clamp with excessive driving capability usually results in unexpected power-on reset action, redundant power dissipation or unpredictable malfunction, the present invention employs the multiple output voltages generated from the surge-to-digital converter 10 to selectively turn on or off the plurality of finger of the big MOSFET clamp depending on the voltage levels of surge events, such that protection flexibility of the clamp circuit 20 is adjusted.

For example, each of the output voltages ($V_{OUTN}$ ... $V_{OUT2}$, $V_{OUT1}$) indicates a digital signal as a transient bit, turning from "0" to "1" when the surge event is detected. As a result, according to the embodiment of the present invention, as shown in FIG. 3, when the surge-to-digital converter 10 of the present invention comprises N surge detection circuits, the surge-to-digital converter is an N-bit surge-to-digital converter generating N output digital signals (i.e $V_{OUTN}$ ... $V_{OUT2}$, $V_{OUT1}$), and a plurality of finger of the clamp circuit is divided into N groups (i.e $Group_N$ ... $Group_2$, $Group_1$) wherein each group is connected to one transient bit, respectively for controlling the fingers of such group should be turned on or not. For instance, when $V_{OUTN}$ is turning from "0" to "1", then the fingers of $Group_N$ of the clamp circuit will be turned on. In one embodiment, when the digital signals (i.e $V_{OUTN}$ ... $V_{OUT2}$, $V_{OUT1}$) are all turning from "0" to "1", then all the groups of fingers of the clamp circuit 20 can be turned on completely, discharging the most surge energy. In other embodiment, if only part of the digital signals are turning from "0" to "1", then the multiple fingers of the clamp circuit 20 will be only turned on partially, discharging a less surge energy. Under such a protection flexibility being implemented, an active on-chip surge protection design with configuration of driving capability dependent on induced surge levels of the present invention is successfully accomplished.

Figure 5:
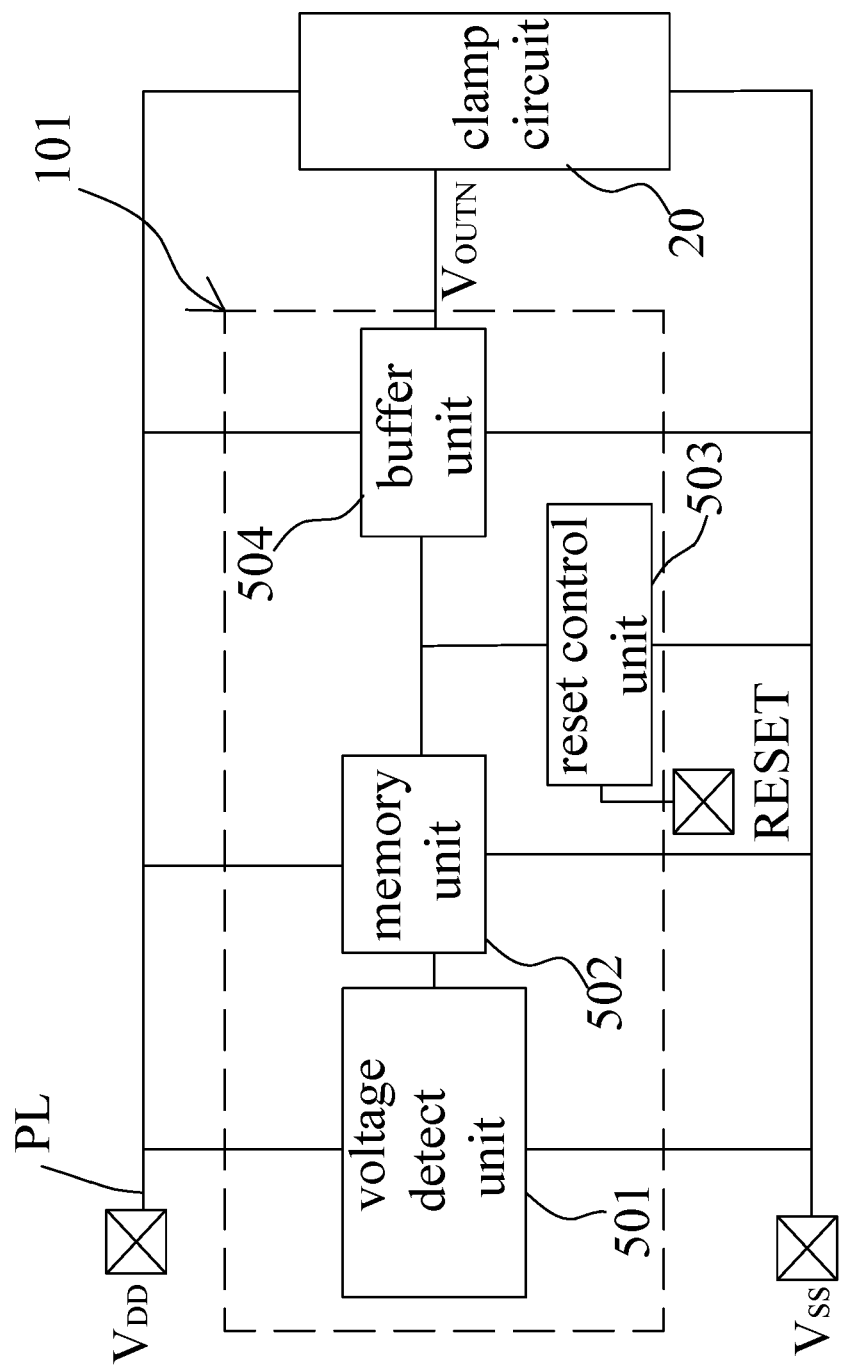
FIG. 5 shows a block diagram of one surge detection circuit in accordance with one embodiment of the present invention.

FIG. 5 shows a block diagram of one surge detection circuit according to one embodiment of the present invention. As shown in FIG. 5, the surge detection circuit 101 of the present invention comprises four parts: a voltage detect unit 501, a memory unit 502, a reset control unit 503 and a buffer unit 504.

The voltage detect unit 501 is electrically connected between the power line PL, the high voltage level $V_{DD}$ and the low voltage level $V_{SS}$ for recognizing the surge event. The memory unit 502 is electrically connected between the power line PL, the high voltage level $V_{DD}$ and the low voltage level $V_{SS}$ and in parallel with the voltage detect unit 501; the buffer unit 504 is electrically connected between the memory unit 502 and the clamp circuit 20; and the reset control unit 503 is electrically connected to the memory unit 502, the buffer unit 504, and the low voltage level $V_{SS}$ for sending a reset signal.

In practical, the reset control unit 503 initializes the output voltage ($V_{OUT}$) of surge detection circuit 101 to initial state. When surge events occur on the power line PL, the voltage detect unit 501 recognizes high induced voltage and write a record to the memory unit 502. As such, the transient bit ($V_{OUT}$) is generated through the buffer unit 504 so as to drive its correspondingly connected group of fingers of the clamp circuit 20 to turn on.

As a result, through the buffer unit 504, $V_{OUT}$ can memorize the occurrence of the surge event. After the surge energy is dissipated through the clamp circuit 20, the surge detection circuit 101 is reset by the reset control unit 503 again for preparing to detect the next surge event.

Figure 6:
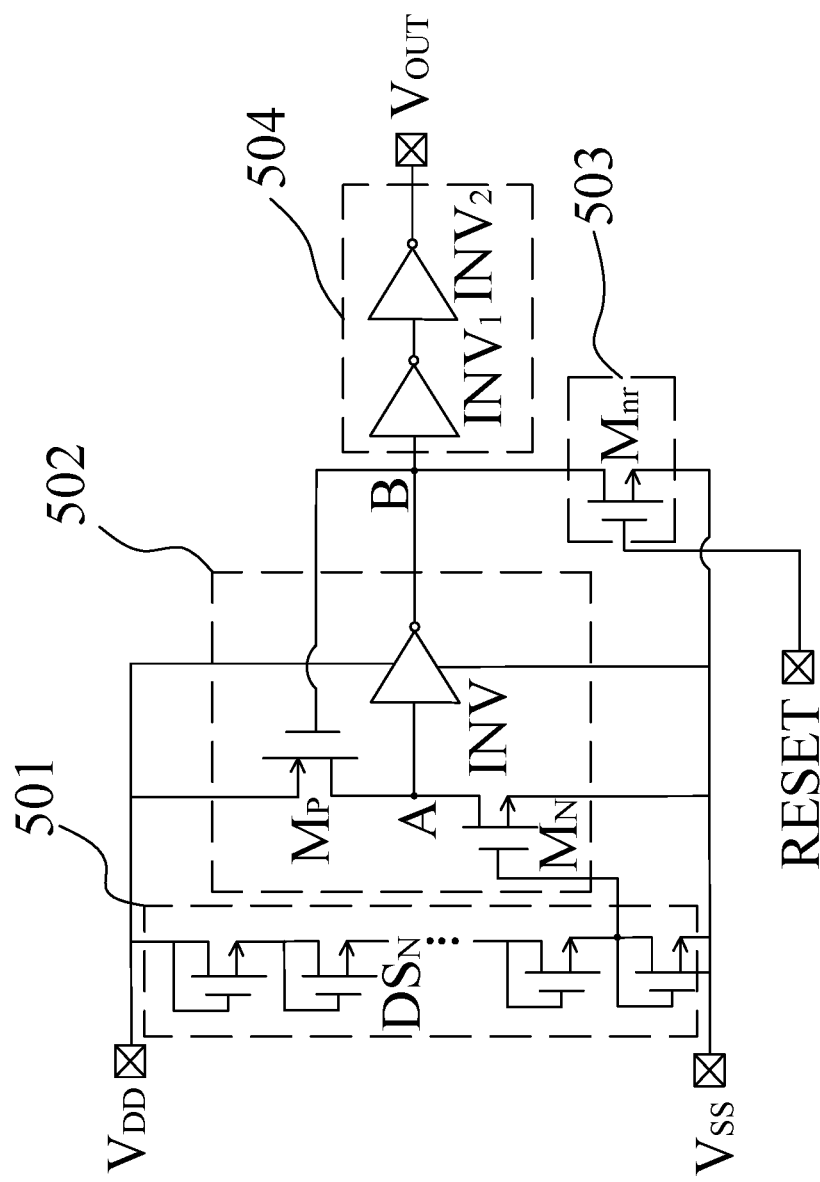
FIG. 6 shows a detailed circuit implementation of the surge detection circuit in accordance with one embodiment of the present invention.

FIG. 6 shows a detailed circuit implementation of the surge detection circuit according to one embodiment of the present invention. As shown in FIG. 6, the voltage detect unit 501 may comprise a serially-stacked NMOS ($DS_N$) as diode-connected string for detecting surge events. The memory unit 502 comprises a PMOS $M_P$, a NMOS $M_N$ and an inverter INV, wherein the PMOS $M_P$ and the NMOS $M_N$ are connected in series, and the inverter INV is connected in parallel with the PMOS $M_P$ and the NMOS $M_N$. The buffer unit 504 comprises two serially connected inverters $INV_1$, $INV_2$. The reset control unit 503 comprises a NMOS $M_{nr}$ which receives a control signal for sending the reset signal. According to the embodiment of the present invention, $M_{nr}$ configuring the reset control unit 503 initializes node $V_{OUT}$ by a control signal "RESET" of logic '1' ($V_{DD}$) before and after surge events.

According to the embodiment of the present invention, under normal circuit and system operation, the serially-stacked NMOS $DS_N$ and the NMOS $M_N$ are kept off with limited leakage current. After the reset operation on the NMOS $M_{nr}$ of the reset control unit 503, node B and the $V_{OUT}$ will be kept at logic '0' (0 V) and $M_P$ turned on to pull up node A.

When a surge event occurs, the overshooting voltage on power lines will turn on the serially-stacked NMOS $DS_N$ to pull up the voltage level at the gate of $M_N$. Therefore, $M_N$ will be turn on to pull down node A. With the operation of the inverter INV, the node B will be charged up from 0 V to $V_{DD}$. The feedback network turning off $M_P$ is helpful to keep the node B at $V_{DD}$. As a result, through the buffer unit 504 from node B, $V_{OUT}$ transited from logic '0' ($V_{SS}$) to logic '1' ($V_{DD}$) can memorize the occurrence of a surge event.

Figure 7:
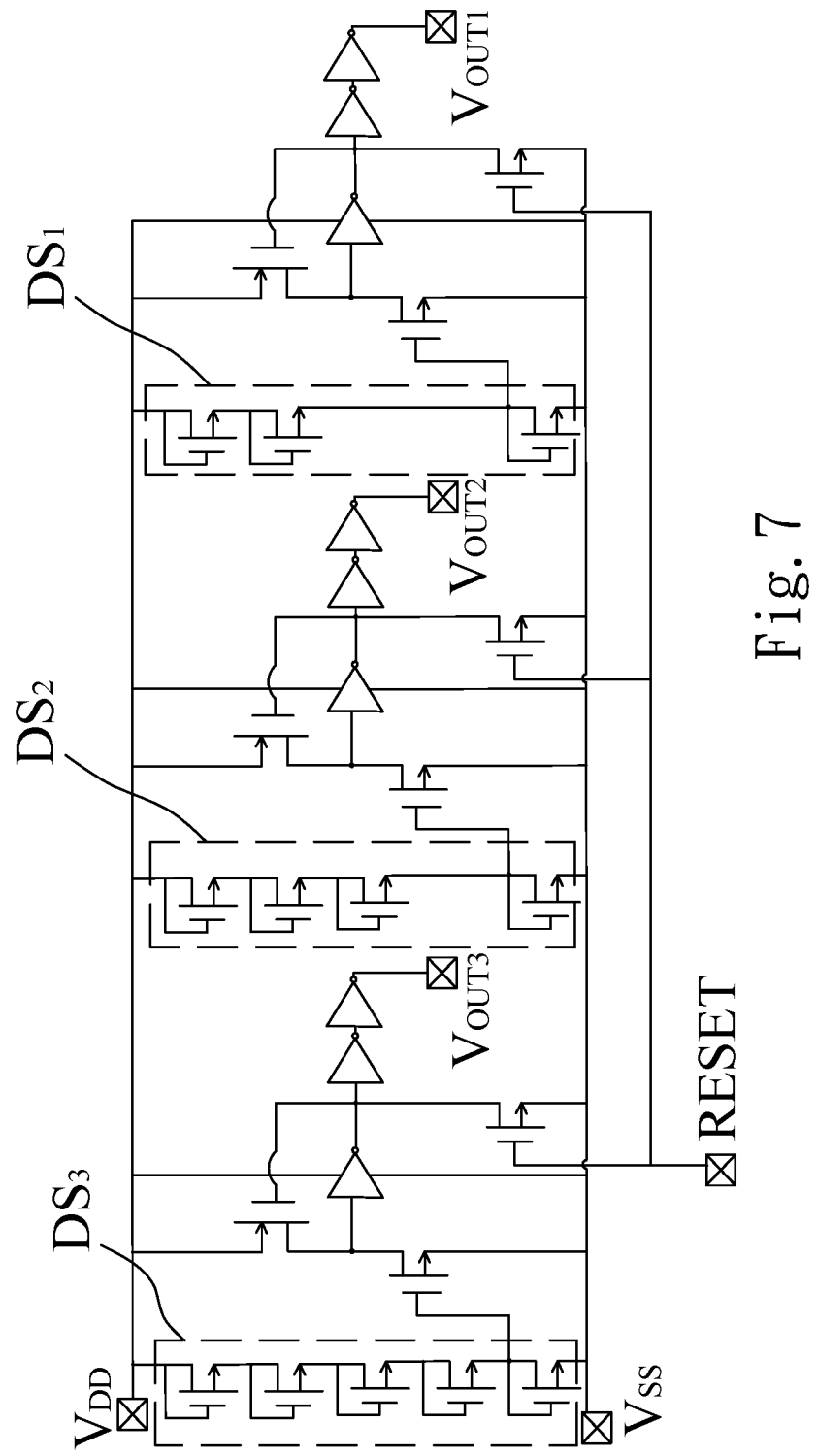
FIG. 7 shows a circuit implementation example of Three-bit invented surge-to-digital converter in accordance with one embodiment of the present invention.

Furthermore, a circuit implementation example of Three-bit invented converter is shown in FIG. 7. Similar circuit operation principle is applied to each stage of three, which means each voltage detect unit of the surge detection circuit may comprise different numbers of stacked diode-connected elements (such as MOSFETs) in each stage so as to make the invented converter distinguish different surge levels. For example, the serially-stacked diode string $DS_3$ at the $3^{rd}$ stage comprises five serially-stacked NMOS; the serially-stacked diode string $DS_2$ at the $2^{rd}$ stage comprises four serially-stacked NMOS; and the serially-stacked diode string $DS_1$ at the 1st stage comprises three serially-stacked NMOS. According to the embodiment of the present invention, the numbers of stacked diode-connected elements of the voltage detect unit affect its detecting sensitivity. When the voltage detect unit is composed of less stacked diode-connected elements, its detecting sensitivity will be higher.

Figure 8A:
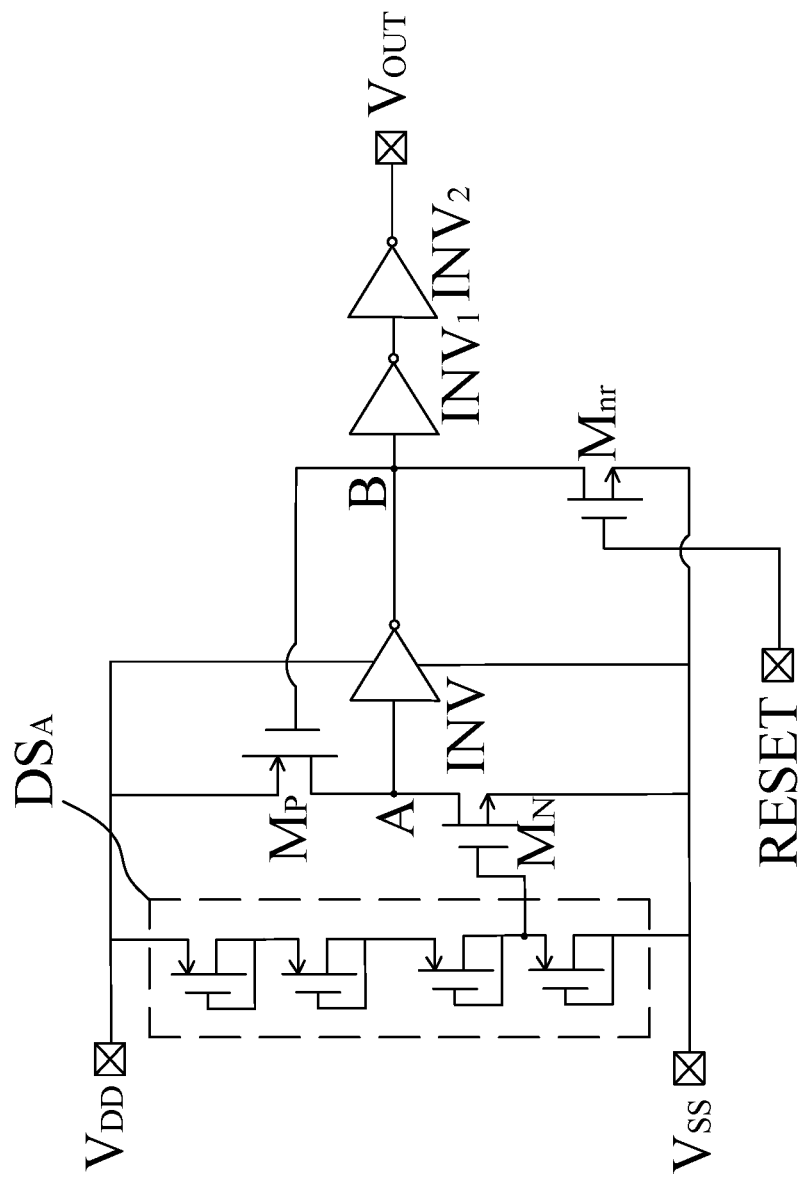
FIG. 8A shows a scheme of the construction and arrangement of serially-stacked diode string in a voltage detect unit with all PMOSFETs in accordance with a first embodiment of the present invention.
Figure 8B:
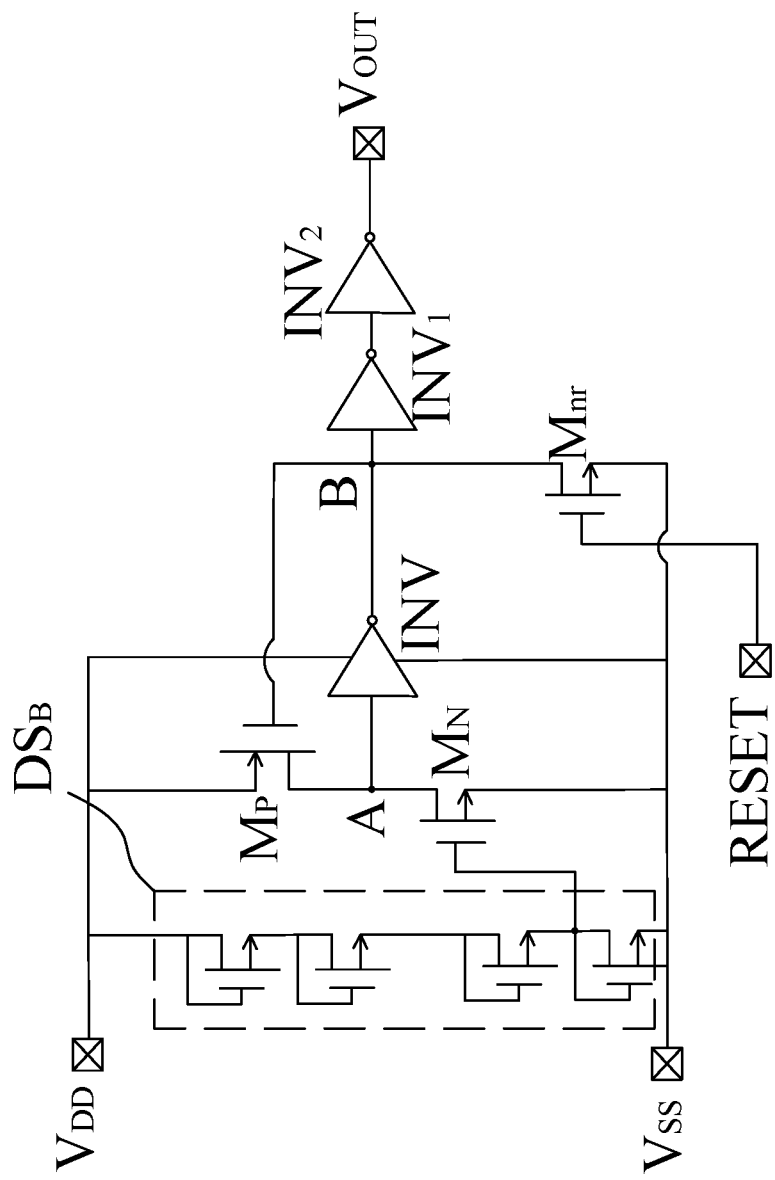
FIG. 8B shows a scheme of the construction and arrangement of serially-stacked diode string in a voltage detect unit with all NMOSFETs in accordance with a second embodiment of the present invention.
Figure 8C:
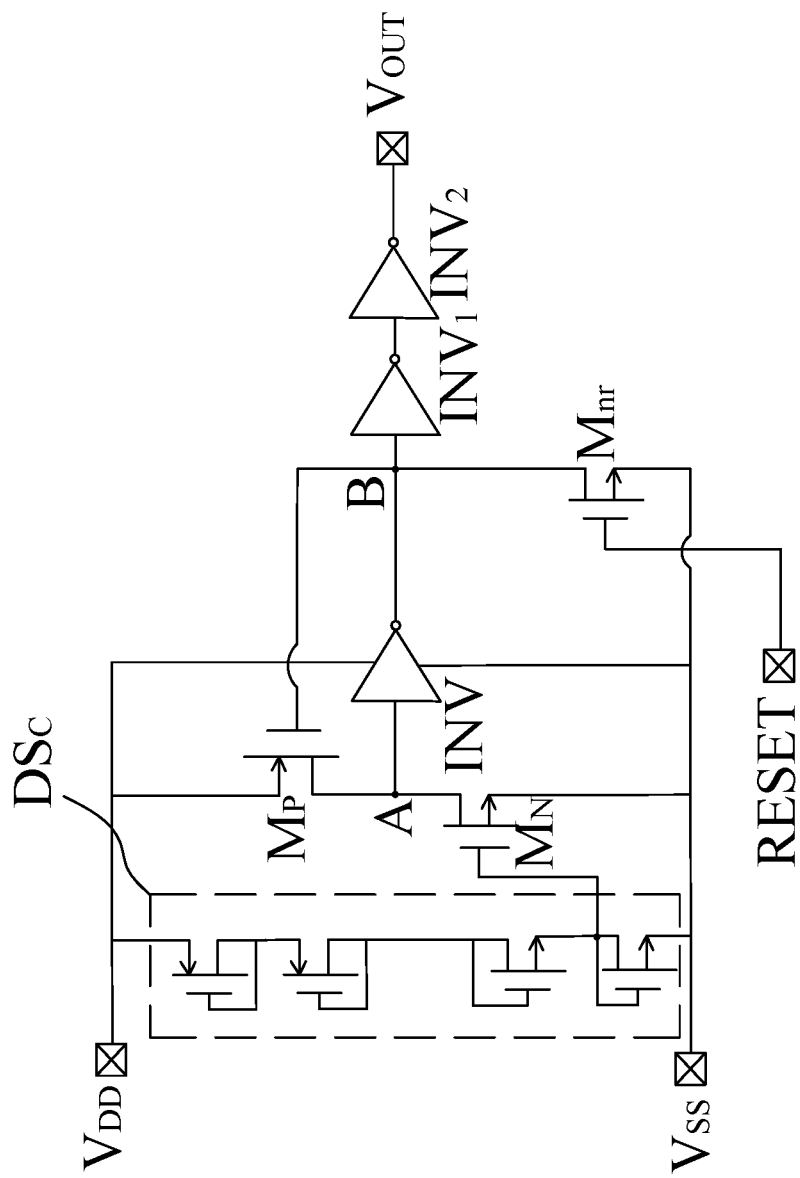
FIG. 8C shows a scheme of the construction and arrangement of serially-stacked diode string in a voltage detect unit with a combination of PMOSFETs and NMOSFETs in accordance with a third embodiment of the present invention.
Figure 8D:
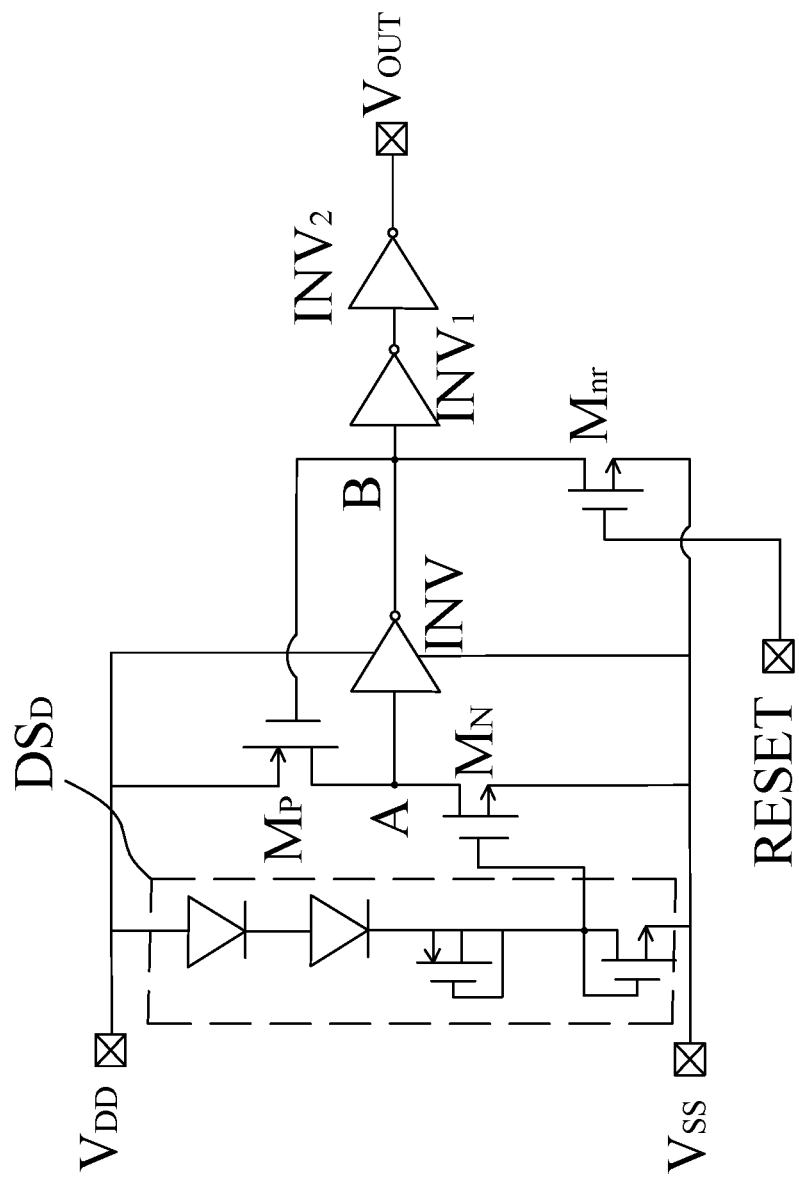
FIG. 8D shows a scheme of the construction and arrangement of serially-stacked diode string in a voltage detect unit with a combination of Diodes and MOSFETs in accordance with a fourth embodiment of the present invention.

On the other hand, the voltage detect unit of the present invention is not limited to being composed of serially-stacked NMOS as previously described. According to other embodiments of the present invention, the voltage detect unit may further comprise a serially-stacked string of PMOSFET, NMOSFET, diode, or a combination of the above. FIG. 8A-8D show four different embodiments of the present invention, wherein FIG. 8A shows a scheme of the construction and arrangement of serially-stacked diode string $DS_A$ with all PMOSFETs, FIG. 8B shows a scheme of the construction and arrangement of serially-stacked diode string $DS_B$ with all NMOSFETs, FIG. 8C shows a scheme of the construction and arrangement of serially-stacked diode string $DS_C$ with a combination of PMOSFETs and NMOSFETs, and FIG. 8D shows a scheme of the construction and arrangement of serially-stacked diode string $DS_D$ with a combination of Diodes and MOSFETs in voltage detect units.

Figure 9A:
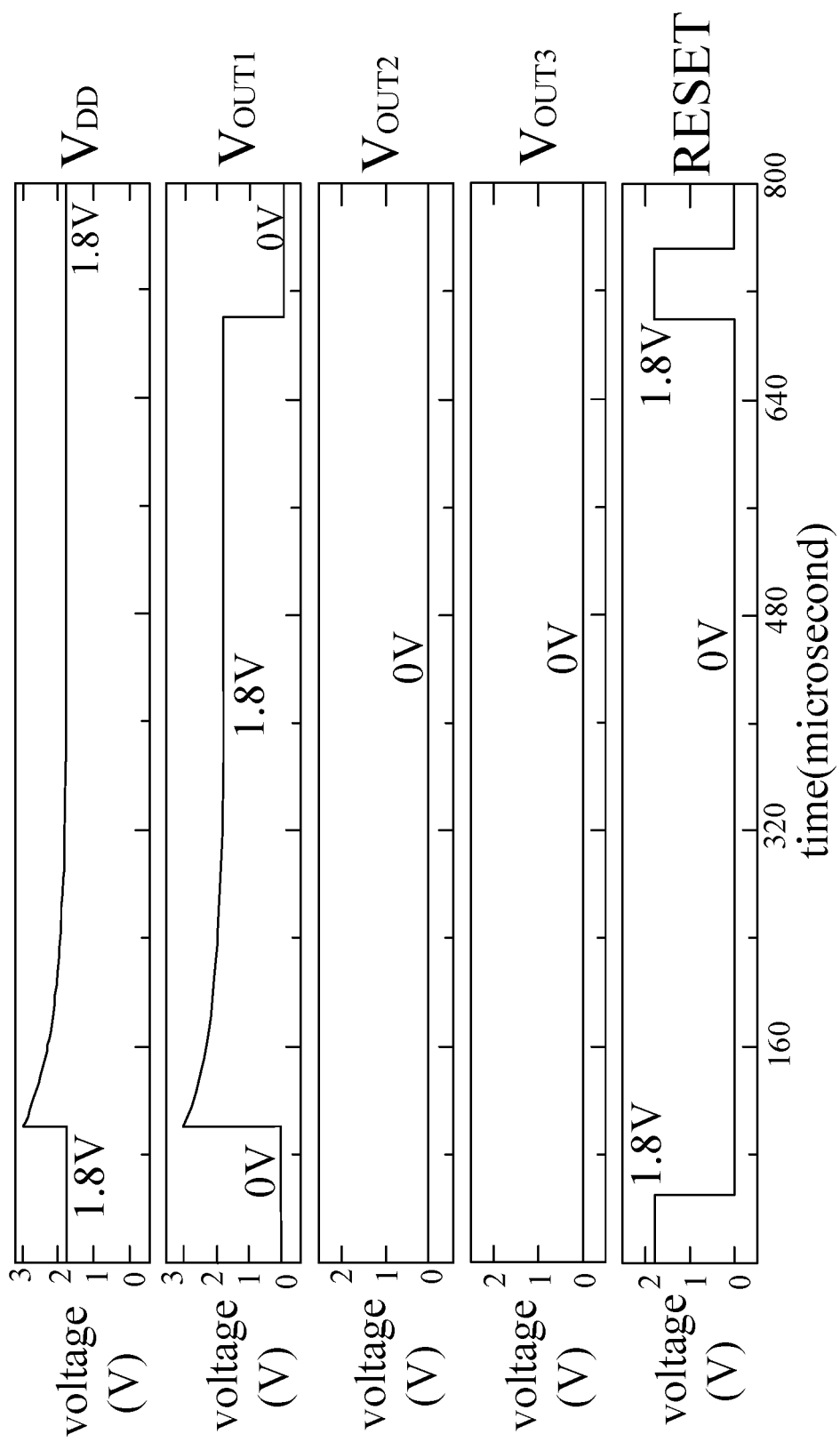
FIG. 9A shows the simulated waveforms of the invented converter with three bits output codes as an example under pulsed voltage of 3V.
Figure 9B:
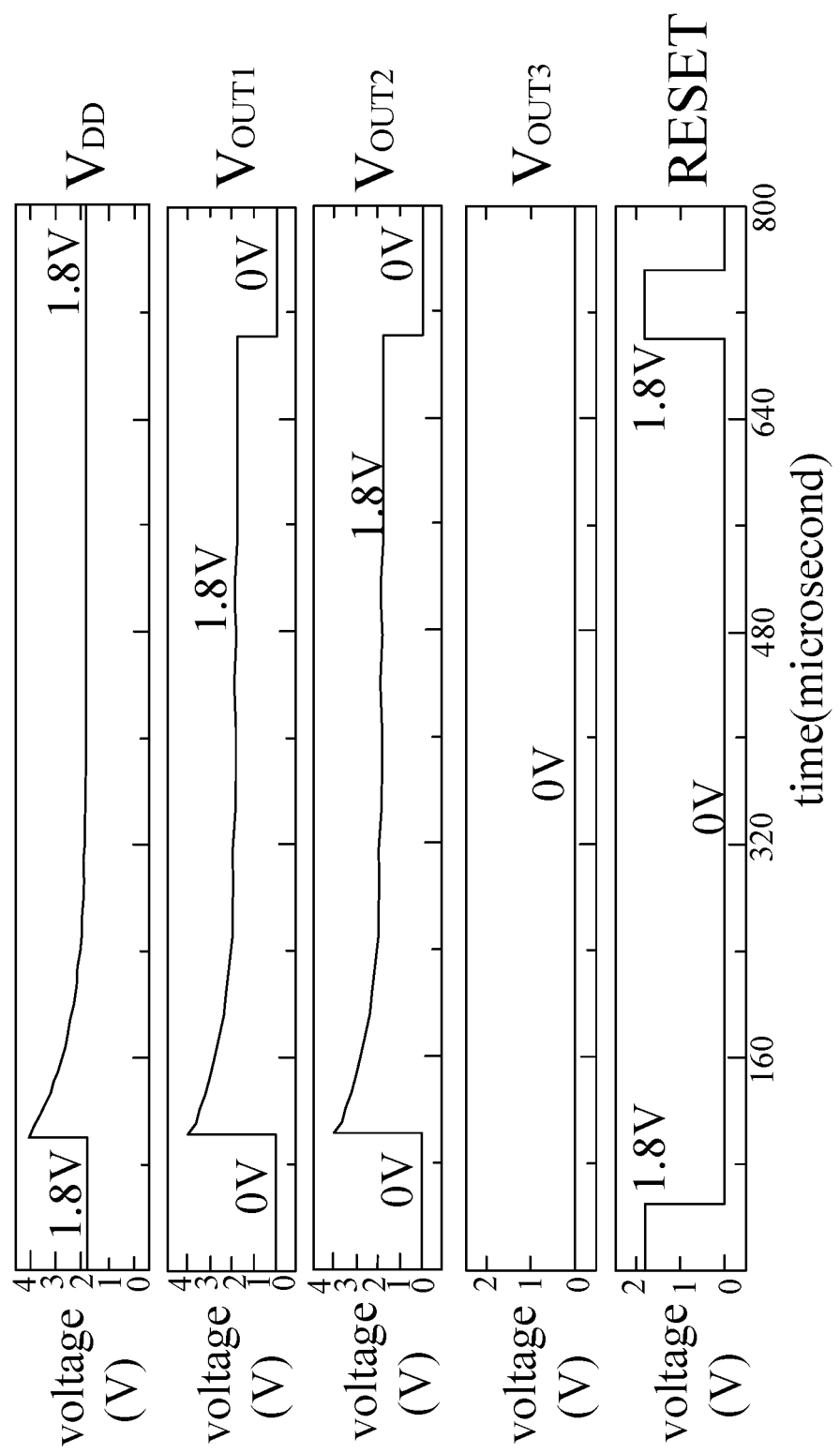
FIG. 9B shows the simulated waveforms of the invented converter with three bits output codes as an example under pulsed voltage of 4V.
Figure 9C:
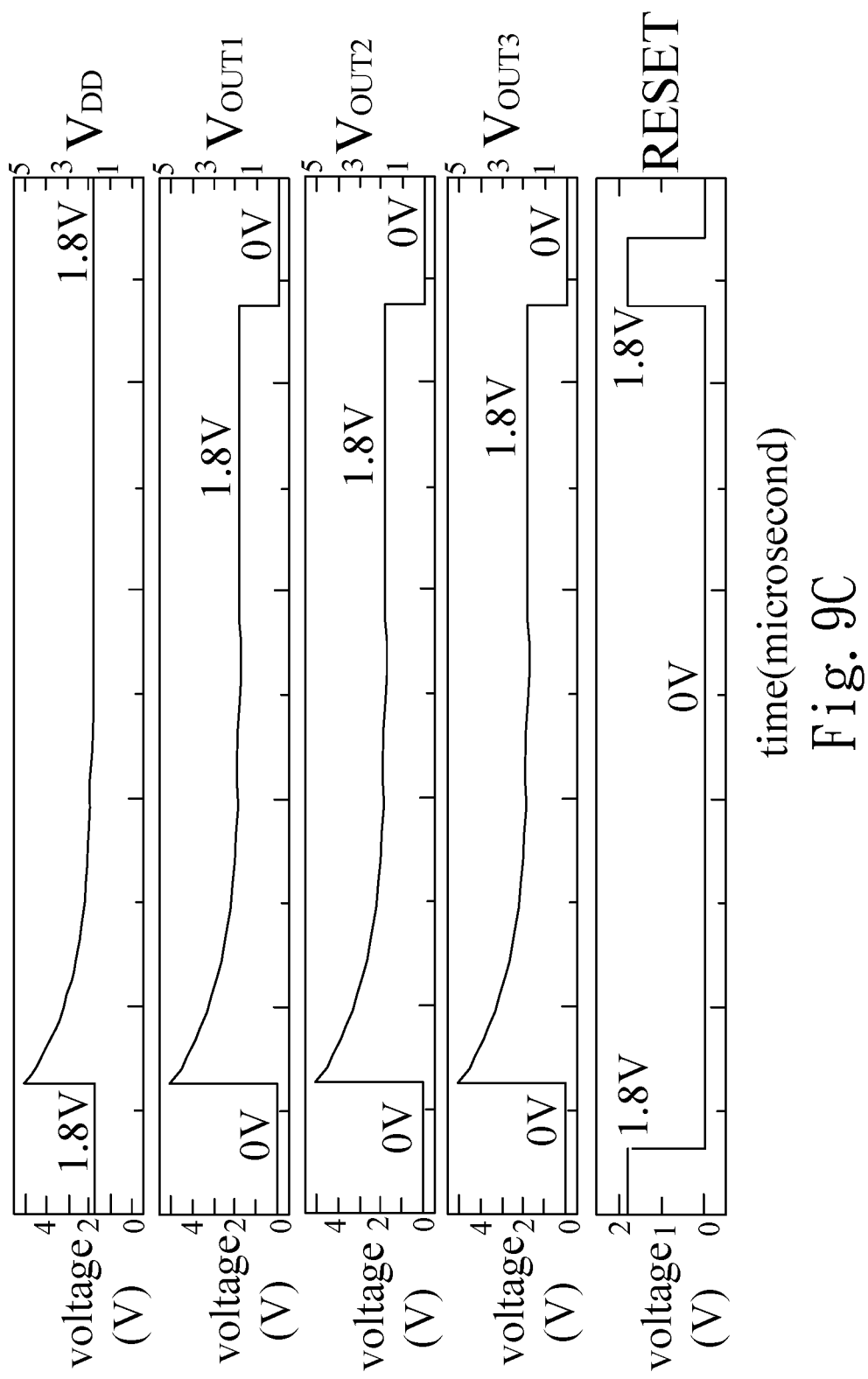
FIG. 9C shows the simulated waveforms of the invented converter with three bits output codes as an example under pulsed voltage of 5V.

In the following, the applicants further provide simulation results for illustrating effects of the present invention. Take a 3-bit surge-to-digital converter for example, and the simulation results under different surge level tests are shown in FIGS. 9A, 9B and 9C. The output digital codes of $V_{OUT1}$, $V_{OUT2}$ and $V_{OUT3}$ transit from '0' to '1' sequentially under three surge tests with increasing pulsed voltage, 3V, 4V and 5V, which are shown in FIGS. 9A, 9B and 9C, respectively. After the reset signal is sent, all output bits will be reset to '0'.

As a result, to sum up, a novel active surge protection structure and multi-bit surge-to-digital converter thereof have been provided in the present invention for configuration of driving capability depending on surge levels. By using such a multi-bit surge-to-digital converter, its multiple output voltages generated thereof are able to selectively turn on or off a plurality of finger of the big MOSFET clamp depending on the voltage levels of surge events, such that protection flexibility of the clamp circuit is adjustable. Moreover, the surge protection scheme of the present invention is beneficial to improve both the system stability as well as surge robustness, which can be applied to an on-chip systematic circuit design to protect ICs from residual surge energy while compared to the conventional design with only board-level surge protections.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An active surge protection structure which is disposed adjacent to a core circuit and electrically connected to a power line where the core circuit is connected, the active surge protection structure comprising:
   a surge-to-digital converter, which is connected to a high voltage level $V_{DD}$ and a low voltage level $V_{SS}$, comprising a plurality of surge detection circuit, wherein each of the plurality of surge detection circuit detects a surge event occurring on the power line and generates a digital signal when the surge event occurs; and
   a clamp circuit, being electrically connected with the power line and the surge-to-digital converter, wherein the clamp circuit is disposed adjacent to the core circuit for dissipating surge energy when the surge event occurs on the power line, and the clamp circuit receives and is driven by a plurality of the digital signal from the surge-to-digital converter such that protection flexibility of the clamp circuit can be adjusted according to the plurality of the digital signal.

2. The active surge protection structure of claim 1, wherein the clamp circuit is a power MOSFET which comprises a plurality of finger, and the plurality of finger is turned on or off depending on the plurality of the digital signal such that protection flexibility of the clamp circuit is adjusted.

3. The active surge protection structure of claim 2, wherein the plurality of finger can be turned on either partially or completely.

4. The active surge protection structure of claim 1, wherein each of the plurality of surge detection circuit further comprises:
   a voltage detect unit connected between the power line, the high voltage level $V_{DD}$ and the low voltage level $V_{SS}$ for recognizing the surge event;
   a memory unit electrically connected between the power line, the high voltage level $V_{DD}$ and the low voltage level $V_{SS}$ and in parallel with the voltage detect unit;
   a buffer unit electrically connected between the memory unit and the clamp circuit, wherein when the voltage detect unit recognizes the surge event, the voltage detect unit writes a record to the memory unit and the digital signal is generated through the buffer unit; and
   a reset control unit electrically connected to the memory unit, the buffer unit, and the low voltage level $V_{SS}$ for sending a reset signal.

5. The active surge protection structure of claim 4, wherein the reset signal is sent to initialize the digital signal to an initial state.

6. The active surge protection structure of claim 5, wherein the reset signal is sent again to reset the digital signal for detecting a next surge event.

7. The active surge protection structure of claim 4, wherein the digital signal is a transient bit, turning from "0" to "1" when the surge event is detected.

8. The active surge protection structure of claim 7, wherein the plurality of surge detection circuit is N surge detection circuit, the surge-to-digital converter is an N-bit surge-to-digital converter, and a plurality of finger of the clamp circuit is divided into N groups connected to the N transient bits, respectively.

9. The active surge protection structure of claim 4, wherein the voltage detect unit further comprises a serially-stacked string of PMOSFET, NMOSFET, diode, or a combination of the above.

10. The active surge protection structure of claim 9, wherein each voltage detect unit of the plurality of surge detection circuit may comprise different numbers of PMOSFET, NMOSFET, diode, or a combination of the above for composing the serially-stacked string.

11. A surge-to-digital converter, which is connected to a power line, comprising a plurality of surge detection circuit, wherein each of the plurality of surge detection circuit detects a surge event occurring on the power line, generates a digital signal when the surge event occurs, and comprises:
    a voltage detect unit connected between the power line, a high voltage level $V_{DD}$ and a low voltage level $V_{SS}$ for recognizing the surge event;
    a memory unit electrically connected between the power line, the high voltage level $V_{DD}$ and the low voltage level $V_{SS}$ and in parallel with the voltage detect unit;
    a buffer unit electrically connected to the memory unit, wherein when the voltage detect unit recognizes the surge event, the voltage detect unit writes a record to the memory unit and the digital signal is generated through the buffer unit; and
    a reset control unit electrically connected to the memory unit, the buffer unit, and the low voltage level $V_{SS}$ for sending a reset signal.

12. The surge-to-digital converter of claim 11, wherein the reset signal is sent to initialize the digital signal to an initial state.

13. The surge-to-digital converter of claim 12, wherein the reset signal is sent again to reset the digital signal for detecting a next surge event.

14. The surge-to-digital converter of claim 11, wherein the digital signal is a transient bit, turning from "0" to "1" when the surge event is detected.

15. The surge-to-digital converter of claim 14, wherein the plurality of surge detection circuit is N surge detection circuit, and the surge-to-digital converter is an N-bit surge-to-digital converter.

16. The surge-to-digital converter of claim 11, wherein the voltage detect unit further comprises a serially-stacked string of PMOSFET, NMOSFET, diode, or a combination of the above.

17. The surge-to-digital converter of claim 16, wherein each voltage detect unit of the plurality of surge detection circuit may comprise different numbers of PMOSFET, NMOSFET, diode, or a combination of the above for composing the serially-stacked string.

18. The surge-to-digital converter of claim 11, wherein the memory unit further comprises a PMOS, a NMOS and an inverter, the PMOS and the NMOS are connected in series, and the inverter is connected in parallel with the PMOS and the NMOS.

19. The surge-to-digital converter of claim 11, wherein the buffer unit further comprises two serially connected inverters.

20. The surge-to-digital converter of claim 11, wherein the reset control unit comprises a NMOS which receives a control signal for sending the reset signal.

* * * * *